US009978817B2

(12) United States Patent
Diekmann et al.

(10) Patent No.: US 9,978,817 B2
(45) Date of Patent: May 22, 2018

(54) OPTOELECTRONIC COMPONENT

(71) Applicant: OSRAM OLED GmbH, Regensburg (DE)

(72) Inventors: Karsten Diekmann, Rattenberg (DE); Philipp Schwamb, Regenburg (DE)

(73) Assignee: OSRAM OLED GmbH, Regensburg (DE)

( * ) Notice: Subject to any disclaimer, the term of this patent is extended or adjusted under 35 U.S.C. 154(b) by 30 days.

(21) Appl. No.: 15/103,057

(22) PCT Filed: Jan. 8, 2015

(86) PCT No.: PCT/EP2015/050246
§ 371 (c)(1),
(2) Date: Jun. 9, 2016

(87) PCT Pub. No.: WO2015/104326
PCT Pub. Date: Jul. 16, 2015

(65) Prior Publication Data
US 2016/0307972 A1 Oct. 20, 2016

(30) Foreign Application Priority Data

Jan. 10, 2014 (DE) .................. 10 2014 100 253

(51) Int. Cl.
*H01L 27/32* (2006.01)
*H01L 51/52* (2006.01)
(Continued)

(52) U.S. Cl.
CPC .......... *H01L 27/3232* (2013.01); *G02F 1/137* (2013.01); *H01L 51/504* (2013.01);
(Continued)

(58) Field of Classification Search
None
See application file for complete search history.

(56) References Cited

U.S. PATENT DOCUMENTS

2006/0109397 A1\* 5/2006 Anandan .......... G02F 1/133603
349/69
2007/0018943 A1\* 1/2007 Bayrle .............. G02F 1/133555
345/102

(Continued)

FOREIGN PATENT DOCUMENTS

DE 102007022090 A1 11/2008
EP 0971016 B1 5/2003
EP 2631949 A2 8/2013

OTHER PUBLICATIONS

"1/8 VGA Cholesteric Display Module with SPI-Compatible Interface", Kent Displays, Inc 240X160CX2.9 SPI, Apr. 4, 2010, 25 pages.

*Primary Examiner* — Ashok Patel
(74) *Attorney, Agent, or Firm* — Slater Matsil, LLP

(57) ABSTRACT

An optoelectronic component and a method to operate the optoelectronic component are disclosed. In an embodiment the optoelectronic component includes an organic light-emitting diode configured to emit radiation through a main emission surface and a liquid crystal element configured to adjust a color location of the radiation, wherein the liquid crystal element is switchable into a first state and into a second state, wherein the liquid crystal element in the first state is suitable for selectively reflecting light of a first wavelength range and in the second state is transparent, and wherein the liquid crystal element is arranged on a rear side of the organic light-emitting diode facing the main emission surface so that light of the first wavelength range that is emitted towards the rear side is at least partially reflected in a direction of the main emission surface in the first state of the liquid crystal element.

12 Claims, 4 Drawing Sheets

(51) Int. Cl.
 G02F 1/137 (2006.01)
 H01L 51/50 (2006.01)
(52) U.S. Cl.
 CPC ...... *H01L 51/5284* (2013.01); *H01L 51/5271* (2013.01); *H01L 51/5281* (2013.01)

(56) References Cited

U.S. PATENT DOCUMENTS

| | | |
|---|---|---|
| 2009/0230415 A1 | 9/2009 | Ide et al. |
| 2011/0164210 A1* | 7/2011 | Tsuda .................... H01L 51/524 349/96 |
| 2011/0267279 A1 | 11/2011 | Alvarez Rivera et al. |
| 2013/0181197 A1 | 7/2013 | Lee et al. |
| 2013/0181615 A1 | 7/2013 | Lee |
| 2014/0063384 A1* | 3/2014 | Li ...................... G02B 27/2214 349/15 |

* cited by examiner

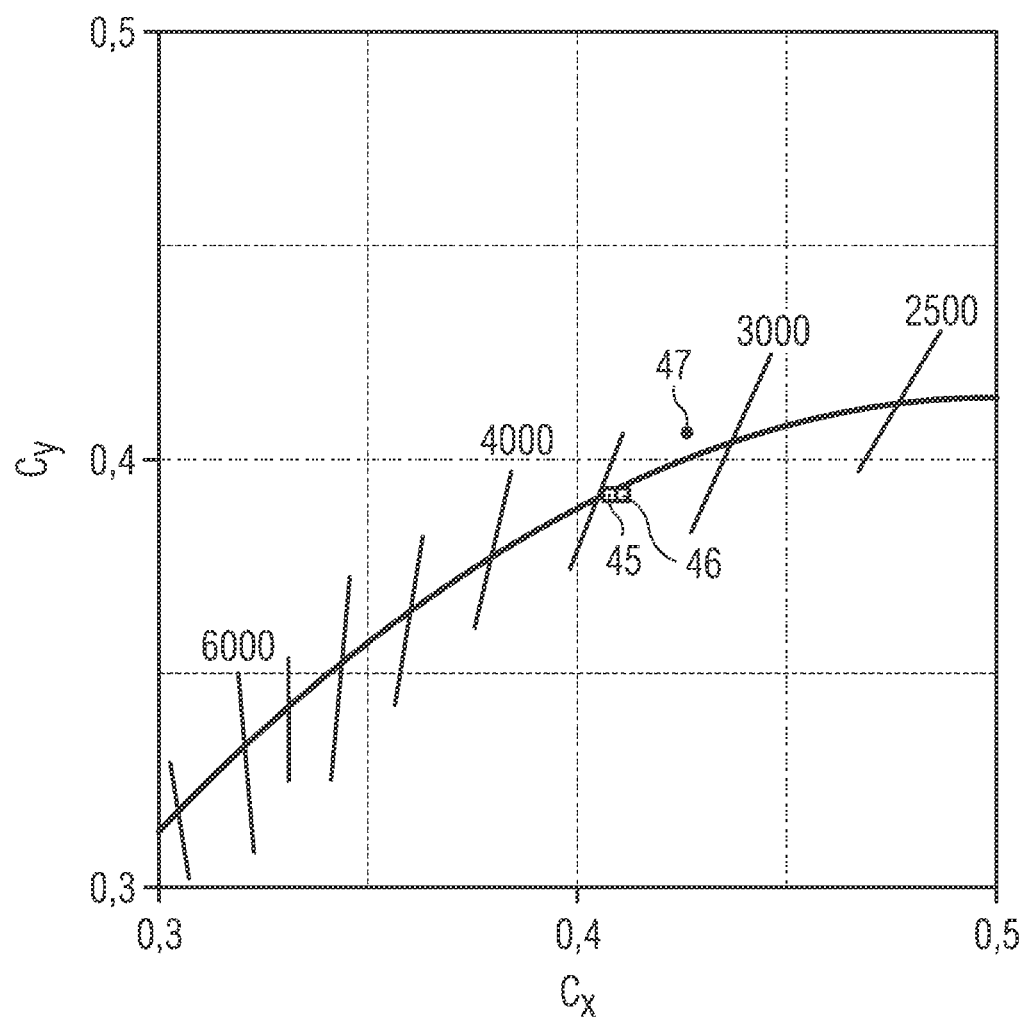

OPTOELECTRONIC COMPONENT

This patent application is a national phase filing under section 371 of PCT/EP2015/050246, filed Jan. 8, 2015, which claims the priority of German patent application 10 2014 100 253.9, filed Jan. 10, 2014, each of which is incorporated herein by reference in its entirety.

TECHNICAL FIELD

The invention relates to an optoelectronic component, which in particular comprises an organic light-emitting diode.

BACKGROUND

An organic light-emitting diode (OLED), which emits a mixed colour, in particular white light, can for example be achieved in that a plurality of organic light-emitting layers are arranged on top of each other in a layer stack. A white light emitting organic light-emitting diode can, for example, have organic light-emitting layers for the colours blue, green and red. The plurality of light-emitting layers can be arranged next to each other instead of on top of each other.

A variation of the colour location in an organic light-emitting diode, which has a plurality of organic light-emitting layers of various colours, is for example possible in that the light-emitting layers are separately controlled by an adjustable current source or voltage source. To this end, the organic light-emitting diode needs to have separately contactable electrodes for the plurality of light-emitting layers and a suitable regulating unit. However, this increases the production effort for the organic light-emitting diode.

SUMMARY OF THE INVENTION

Embodiments of the invention provide an improved optoelectronic component, with an organic light-emitting diode in which a colour location of the optoelectronic component is changeable. Further embodiments provide an advantageous method for operating the optoelectronic component.

According to at least one embodiment, the optoelectronic component comprises an organic light-emitting diode, which is provided for emitting radiation through a main emission surface. The organic light-emitting diode preferably emits a mixed light, in particular white light. The organic light-emitting diode can, for example, have two or more organic light-emitting layers for generating the mixed light. In such case, the plurality of organic light-emitting layers emit light in various wavelength ranges.

In various embodiments the organic light-emitting diode is in particular set up to generate a mixed light, preferably white light, by additive colour mixing of at least two, preferably at least three, organic light-emitting layers. It can, for example, be provided that the organic light-emitting diode has a first organic light-emitting layer that emits blue light, a second organic light-emitting layer that emits green light and a third organic light-emitting layer that emits red light. Alternatively, there can be provided two organic light-emitting layers, wherein the first organic light-emitting layer emits blue light and the second organic light-emitting layer emits yellow or orange light.

In various embodiments the plurality of light-emitting organic layers are preferably arranged on top of each other in the organic light-emitting diode, wherein the organic light-emitting layers arranged on top of each other may be separated from each other by one or more transparent intermediate layers, such as charge carrier generating layers, for example.

In various other embodiments the organic light-emitting diode is advantageously designed as a two-way emitting organic light-emitting diode, i.e. it emits light both to a front side provided as main emission surface and to a rear side opposite to the main emission surface. To this end, a substrate, on which a layer stack of the organic light-emitting diode is placed, as well as the layers contained in the layer stack of the organic light-emitting diode, in particular an anode electrode layer and a cathode electrode layer, are advantageously transparent for the emitted radiation.

According to at least one embodiment, the optoelectronic component has a liquid crystal element for adjusting a colour location of the radiation emitted by the organic light-emitting diode through the main emission surface. Advantageously used is a liquid crystal element that can be switched into a first state and into a second state, wherein the liquid crystal element in the first state is suitable for selectively reflecting light of a first wavelength range and in the second state is transparent. The liquid crystal element can, for example, be switched from the first state into the second state by applying an electrical voltage.

The liquid crystal element can in particular be a cholesteric liquid crystal element, which contains a liquid crystal layer, the latter having a planar texture in the first state and a focal conic texture in the second state. A cholesteric liquid crystal element has the feature that it selectively reflects light of a specific wavelength range in the state of planar texture. In particular, the cholesteric liquid crystal element may have the feature that it reflects yellow light in the first state with the planar texture, wherein the reflection can, for example, equal approximately 35% as a maximum. In the second state with the focal conic texture, the cholesteric liquid crystal element is advantageously transparent.

The proposal made herein for specifically adjusting the colour location of the radiation emitted from an optoelectronic component with an organic light-emitting diode avails itself of the different optical characteristics of the liquid crystal element in the first state and the second state. The light of the first wavelength range, which is emitted by the organic light-emitting diode towards the rear side, is reflected at least partially in the direction of the main emission surface in the first state of the liquid crystal element. For example, if the first wavelength range, which is reflected in the first state, comprises yellow light, the proportion of yellow light in the spectrum of the light emitted through the main emission surface of the organic light-emitting diode increases. Conversely, if the liquid crystal element is switched into the second state, in which it is substantially transparent, the light emitted by the organic light-emitting diode towards the rear side is not reflected back to the main emission surface, and therefore the emission spectrum of the light emitted through the main emission surface is not substantially impacted by the liquid crystal element.

Due to the feature of the liquid crystal element of selectively reflecting light of the first wavelength range in the first state, light from the first wavelength range is additionally added to the emission spectrum in the first state. This advantageously causes the colour location of the radiation emitted by the optoelectronic component to shift in the direction of the first wavelength range, which is selectively reflected by the liquid crystal element in the first state. The colour location of the radiation emitted through the main emission surface can thus be changed from the first state into the second state or from the second state into the first state by switching the liquid crystal element. The change in colour location advantageously ensues in the optoelectronic component with no separate activation of the plurality of organic light-emitting layers. The organic light-emitting layers thus do not need to be separately electrically contactable, which advantageously reduces the production effort for the organic light-emitting diode.

In a preferred configuration a surface of the liquid crystal element facing away from the organic light-emitting diode is provided with a light-absorbing layer. This advantageously causes the light emitted by the organic light-emitting diode towards the rear side to be absorbed in the second state of the liquid crystal element. Furthermore, the light-absorbing layer in the first state absorbs the proportion of the radiation emitted towards the rear side, which is not selectively reflected from the liquid crystal element towards the main emission surface. Thus, the optoelectronic component does not emit towards the rear side of the organic light-emitting diode, but instead preferably only through the main emission surface.

In a preferred configuration a light emitted through the main emission surface has a lower colour temperature in the first state than in the second state. It can in particular be provided that the organic light-emitting diode is set up to emit cool white light, i.e. white light with a comparatively high colour temperature. The spectrum of the emitted radiation of the organic light-emitting diode emitting cool white light has a comparatively high proportion of the blue spectrum. In the first state of the liquid crystal element, the back reflection of the yellow light emitted by the organic LED increases the yellow component in the emitted spectrum, thus reducing the colour temperature of the emitted radiation. This in particular causes the optoelectronic component in the second state to emit the non-impacted cool white emission spectrum of the organic light-emitting diode, whereas warm white light is emitted in the first state due to the increase of the yellow component in the emitted spectrum.

In a preferred configuration the organic light-emitting diode has an asymmetrical light emission, wherein more radiation is emitted towards the rear side than towards the main emission surface. For example, it can be provided that the organic light-emitting diode in operation emits approximately 30% of the emitted radiation towards the main emission surface, i.e. towards the front side, whereas approximately 70% of the emitted radiation is emitted towards the rear side. Such an asymmetrical radiation characteristic can occur in the event of two-way emitting organic light-emitting diodes due to the varying transparency in the layers for the various wavelengths contained in the layer stack. In order to achieve a largest possible light emission, the organic light-emitting diode would usually need to be oriented in such a way that the side with the strongest light emission faces the main emission surface.

However, with regard to the principle proposed here, it can be advantageous to arrange the side with the stronger light emission in the direction of the rear side on which the liquid crystal element is arranged. As only a comparatively low proportion of the radiation is emitted to the front side and a larger proportion to the rear side in this case, due to the orientation of the organic light-emitting diode, the selective reflection of the radiation from the first wavelength range towards the main emission surface in the first state has a particularly strong impact on the emitted overall radiation when switching between the first state and the second state.

In this embodiment, a particularly large shift of the colour location of the emitted radiation can be achieved.

In an alternative embodiment the organic light-emitting diode has an asymmetrical light emission, wherein more radiation is emitted towards the main emission surface than towards the rear side. In this configuration a stronger emission to the main emission surface and thus a stronger luminosity is achieved. As, however, only a low proportion of the emitted radiation is emitted towards the rear side, the impact of the addition of the radiation of the first wavelength range by selective reflection on the rear side in the first state is perceptibly lower than in the previously described embodiment. The configuration in which the organic light-emitting diode is oriented in such a way that the side with the stronger light emission faces the main emission surface is then advantageous when a great deal of luminosity is intended to be achieved and only a comparatively small shift of the colour location and/or the colour temperature is intended to be achieved by switching between the first state and second state.

According to an embodiment of a method for operating the optoelectronic component, the liquid crystal element for changing the colour temperature of the radiation emitted by the optoelectronic component is switched from the first state into the second state or from the second state into the first state by means of a voltage source. For example, a cholesteric liquid crystal element can be switched from the first state with a planar texture into the second state with a focal conic texture or vice versa by applying an electrical voltage to the liquid crystal element by means of the voltage source. The cholesteric liquid crystal element is advantageously bistable, i.e. an electrical voltage need only be applied for switching between the first state and the second state or vice versa. The method thus allows the colour location of the radiation emitted by the optoelectronic component to be adjusted in an energy-efficient manner.

In one configuration of the method the voltage source is operated in pulse mode, in order to switch the liquid crystal element from the first state into the second state or from the second state into the first state in a predetermined time sequence. The pulse frequency is preferably so high that the temporal sequence of the pulse is imperceptible to the human eye. The radiation emitted by the optoelectronic component, which is perceptible to the human eye, thus has an averaged colour location that is dependent on what fraction of a time unit the liquid crystal element is in the second state. For example, the liquid crystal element can be periodically switched back and forth between the first state and the second state in such a way that it is in the first state during a periodic duration T of the pulsed voltage generated by the voltage source during a time $t_1$ and is in the second state during a time $t_2=T-t_1$. In such case, the colour location of the emitted radiation is, for instance, adjusted by the setting of the quotient $t_1/T$. This allows advantageous colour locations to be specifically adjusted between the colour location of the radiation emitted in the first state and the colour location of the radiation emitted in the second state. For example, this causes the colour location of the radiation emitted by a white light emitting organic light-emitting diode to be continuously adjustable between a warm white hue and a cool white hue.

BRIEF DESCRIPTION OF THE DRAWINGS

In the following, the invention is explained in more detail on the basis of exemplary embodiments in conjunction with FIGS. 1 to 5.

The figures show in.

Identical or identically acting components are furnished with identical reference signs in the illustrations. The components shown as well as the size ratios of the components amongst one another should not be considered as true to scale.

DETAILED DESCRIPTION OF ILLUSTRATIVE EMBODIMENTS

Figure 1:
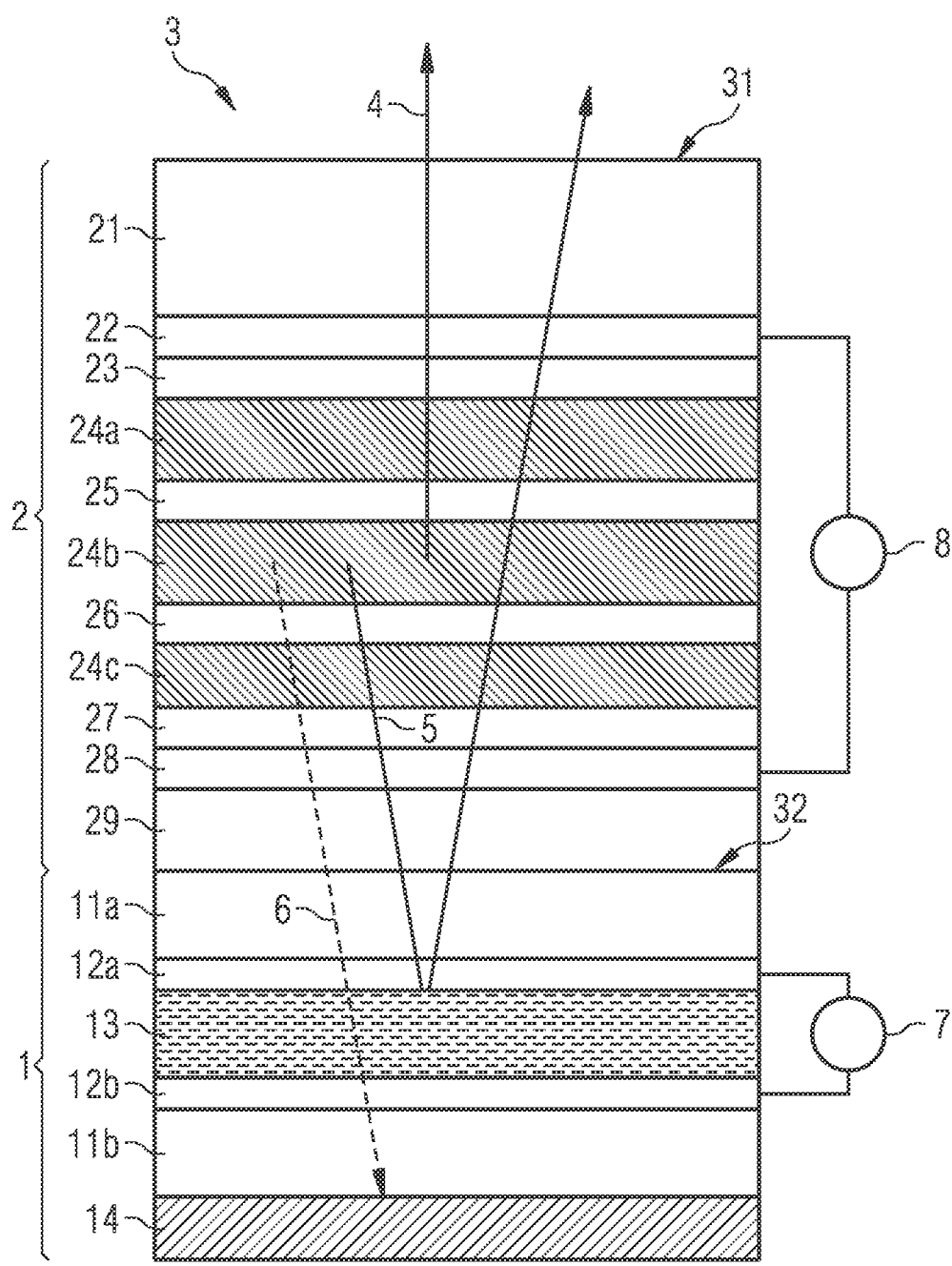
FIG. 1 a schematic illustration of a cross-section through an optoelectronic component according to a first exemplary embodiment, FIG. 2 a schematic illustration of a cross-section through an optoelectronic component according to a second exemplary embodiment, FIG. 3 a graphic illustration of the emission spectrums of the optoelectronic component according to the first exemplary embodiment in the first state and the second state of the liquid crystal element, FIG. 4 a graphic illustration of the emission spectrums of the optoelectronic component according to the second exemplary embodiment in the first state and the second state of the liquid crystal element, and FIG. 5 a graphic illustration of the colour locations of the radiation emitted by the optoelectronic components pursuant to the exemplary embodiments in a CIE colour diagram.

According to a first embodiment, the optoelectronic component 3 shown in FIG. 1 has an organic light-emitting diode 2, which is provided for emitting radiation 4 through a main emission surface 31. The organic light-emitting diode 2 is preferably a white light emitting organic light-emitting diode, in which the white light is generated by additive colour mixing of the radiation emitted by a plurality of organic light-emitting layers 24a, 24b, 24c.

In order to generate white light, the organic light-emitting diode 2 has at least two, or preferably at least three, organic light-emitting layers 24a, 24b, 24c. For example, the organic light-emitting diode 2 can have a first organic light-emitting layer 24a for emitting blue light, a second organic light-emitting layer 24b for emitting green light and a third organic light-emitting layer 24c for emitting red light. The plurality of organic light-emitting layers 24a, 24b, 24c is arranged on top of each other in the layer stack of the organic light-emitting diode 2.

An anode 22 and a cathode 28 are provided for electrical contacting, wherein, for example, a hole-transporting layer 23 can be arranged between the anode 22 and the organic light-emitting layers 24a, 24b, 24c and an electron-transporting layer 27 between the cathode 28 and the organic light-emitting layers 24a, 24b, 24c. The anode 22 and the cathode 28 are, for example, connected to a current source 8, which is preferably a constant current source. The organic light-emitting layers 24a, 24b, 24c can, for example, be separated by intermediate layers 25, 26, wherein the intermediate layers 25, 26 can in particular be so-called charge generation layers (CGL).

The organic light-emitting diode 2 is advantageously a two-way emitting organic light-emitting diode, which partially emits radiation towards the main emission surface 31 and partially to the rear side 32. A substrate 21 and a transparent encapsulation 29 on the side facing the substrate 21 are each advantageously transparent, and therefore radiation can exit from both sides of the organic light-emitting diode 2. Furthermore, the anode 22 and the cathode 28 are also preferably each designed as transparent electrode layers. The transparent electrode layers 22, 28 can, for example, be made of transparent conductive oxides, such as ITO or of very thin metal layers, for example.

The organic light-emitting diode 2 is, for example, formed by a layer stack, which has a substrate 21, an anode 22, a hole-transporting layer 23, a first organic light-emitting layer 24a, an intermediate layer 25, a second light-emitting organic layer 24b, an intermediate layer 26, a third organic light-emitting layer 24c, an electron-transporting layer 27, a cathode 28 and a transparent encapsulation 29. The transparent encapsulation 29 can have a cover glass in one configuration.

The organic light-emitting diode 2 need not necessarily have the same structure as the one shown here as an example. Instead, for example, the organic light-emitting layers 24a, 24b, 24c can be arranged in a different sequence. Furthermore, for example, the intermediate layers 25, 26 or the electron-transporting layer 23 or the hole-transporting layer 27 may not be present in alternative configurations.

A liquid crystal element 1 is arranged on a rear side 32 of the organic light-emitting diode 2 facing the main emission surface 31, the liquid crystal element 1 serving to adjust a colour location of the radiation 4 emitted by the organic light-emitting diode through the main emission surface 31. The liquid crystal element 1 has a liquid crystal layer 13, which is arranged between two electrodes 12a, 12b. The electrodes 12a, 12b are connected to a voltage source 7 for electrical contacting. The liquid crystal layer 13 and the electrodes 12a, 12b thereof can, for example, be arranged between two transparent cover layers 11a, 11b.

The liquid crystal layer 13 can be switched into a first state and into a second state by the voltage source 7, which is connected with the electrodes 12a, 12b. The liquid crystal element 13 is characterized in the first state by selectively reflecting light of a first wavelength range. This causes part of the radiation 5, which is emitted in the direction of the rear side 32 by the organic light-emitting diode 2, to be reflected by the liquid crystal element 1 in the direction of the main emission surface 31. The radiation of the optoelectronic component 3 emitted through the main emission surface 31 in the first state of the liquid crystal element 1 thus comprises both the radiation 4 directly emitted by the plurality of organic light-emitting layers 24a, 24b, 24c towards the main emission surface 31 and part of the radiation 5 emitted in the direction of the rear side 32, which is reflected at the liquid crystal element 1.

As the liquid crystal element 13 does not reflect the entire spectrum of the radiation emitted by the organic light-emitting diode 2, but instead selectively reflects radiation in the first wavelength range, the proportion of the radiation of the first wavelength range in the emitted overall spectrum of the optoelectronic component 3 is thus increased. The first wavelength range comprises part of the radiation emitted by the organic light-emitting layers 24a, 24b, 24c, for example yellow light. Thus, in such case, the yellow component in the white light emitted through the main emission surface 31 by the organic light-emitting diode 2 in the first state of the liquid crystal element 1 is increased. The unchanged spectrum of the organic light-emitting diode 2, i.e. the emitted spectrum without the back-reflecting radiation, can in particular be a cool white light, i.e. white light with high colour temperature. Increasing the yellow component by means of the selective reflection of yellow light in the first state of the liquid crystal element 1 increases the colour temperature of the cool white light, and therefore, for example, warm white light with a low colour temperature is emitted.

The liquid crystal element 1 selectively reflecting in the first state can be switched into a second state, in which the liquid crystal element 13 is substantially transparent, by means of the electrodes 12a, 12b by a voltage pulse of the voltage source 7. In such state, light 6 of the organic light-emitting diode emitted in the direction of the rear side 32 is substantially not reflected by the liquid crystal layer 13, but instead permeates the liquid crystal layer 13. A light-absorbing layer 14 is advantageously arranged on a surface of the liquid crystal element 1 facing away from the organic light-emitting diode 2, the light-absorbing layer 14 absorbing the transmitted radiation 6 in the second state of the liquid crystal layer 13. Thus, in the second state of the liquid crystal element 1, the radiation 6, emitted towards the rear side 32 of the organic light-emitting diode 2, does not significantly contribute towards the overall emission through the main emission surface 31, and therefore the emitted spectrum of the optoelectronic component 3 substantially corresponds to the radiation 4 of the organic light-emitting diode emitted towards the main emission surface 31.

In the second state of the liquid crystal element 1, for example, cool white light is emitted by the organic light-emitting diode 2, the colour location of which can be shifted into the first state, in particular in the direction of warm white light, by selectively mixing yellow light at a lower colour temperature. The optoelectronic component thus advantageously constitutes a white light source, the colour location of which, in particular the colour temperature, can be switched between two states by means of the voltage source 7.

The liquid crystal element 1 is preferably a cholesteric liquid crystal element 1, which has a liquid crystal layer 13, which has a planar texture in the first state and a focal conic texture in the second state. Such a cholesteric liquid crystal element, known per se, is characterized that it selectively reflects light of a first wavelength range, for example yellow light, in the first state, and is transparent in the second state. The cholesteric liquid crystal layer can, for example, comprise cholesteryl carboxylate. An advantage of a cholesteric liquid crystal layer 13 is in particular that the use of a polarization filter is not a necessary prerequisite to achieve the optical function. The liquid crystal element 1 can thus be advantageously free of polarization filters.

Alternatively, the liquid crystal element can be based on another liquid crystal technology as well. For example, it is also possible that the liquid crystal element 1 is a nematic liquid crystal layer 13, for example of the TN (Twisted Nematic) or STN (Super Twisted Nematic) type. The liquid crystal element can also be a bistable nematic or a ferroelectric liquid crystal element. In such technologies, however, the liquid crystal element usually needs to have polarization filters for optically effective operation, whereby the reflection can be reduced and/or the absorption disadvantageously increased. Furthermore, in such technologies, a colour filter may need to be used in order to achieve a reflection in a desired spectral range.

It is advantageously possible in the optoelectronic component to switch comparatively quickly between the first state and the second state of the liquid crystal element. In particular in the case of a cholesteric liquid crystal element, the first state and the second state are each advantageously stable. It is, for example, possible to move the liquid crystal layer 13 into the first state with the selectively reflecting planar texture by means of a voltage pulse. The planar texture can, for example, be transferred back to the focal conic texture, which is also stable with no externally applied voltage, by means of an even greater voltage pulse. In other words, the cholesteric liquid crystal layer is bistable.

Switching between the first state and the second state can ensue so quickly that the human eye is unable to perceive the emitted spectrum of the first state or the second state, but instead only perceives an averaged emission spectrum. For example, the switch can ensue at a frequency of at least 50 Hz. The averaged colour impression depends on what fraction $t_1/T$ of a time unit T the liquid crystal element 1 is in the first state and what fraction $t_2/T$ of the time unit the liquid crystal element 1 is in the second state. An appropriate setting of $t_1$ and $t_2$ can thus generate a colour location of the emitted radiation, which is continuously adjustable between the colour location of the first state and the colour location of the second state.

Figure 3:
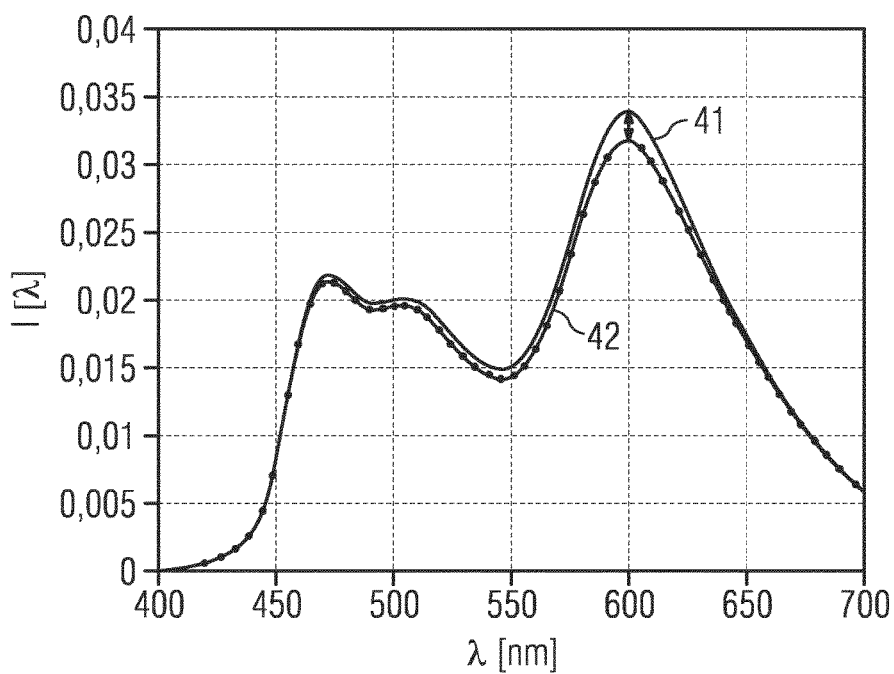

FIG. 3 shows the spectrum $I(\lambda)$ of the radiation emitted through the main emission surface 31 in an optoelectronic component 3 pursuant to one embodiment. The graph 41 shows the emission spectrum in the first state of the liquid crystal element and the graph 42 the emission spectrum in the second state of the liquid crystal element. At a wavelength of approximately 600 nm, the emitted intensity in the yellow spectral range in the first state, in which the liquid crystal element selectively reflects yellow light towards the main emission surface, is greater than in the second state, in which the liquid crystal element is substantially transparent. Thus, white light with a higher colour temperature than in the second state is emitted in the first state.

The organic light-emitting diode 2 in the exemplary embodiment in FIG. 1 can have an asymmetrical radiation characteristic. The organic light-emitting diode 2 in the embodiment in FIG. 1 emits more radiation towards the main emission surface 31 than towards the facing rear side 32, regardless of the liquid crystal element 1. This can, for example, be due to the fact that the substrate 21 has a greater transparency for the emitted radiation than the transparent encapsulation 29 on the rear side 32. In addition, in the event of a two-way emitting organic light-emitting diode 2, there are further options for asymmetrically creating the radiation characteristic for the main emission surface 31 and for the rear side 32, for example by adjusting the layer thicknesses of the layers in the layer stack, by which microcavities can be formed. The radiation characteristic can, for example, be so asymmetric that a minimum of 60%, a minimum of 65% or even a minimum of 70% of the emitted radiation is emitted towards the main emission surface 31, whereas a corresponding maximum of 40%, a maximum of 35% or even a maximum of 30% is emitted towards the rear side 32. The lower the radiation emission towards the rear side 32 is, the lower the impact of the selective reflection on the liquid crystal element 1 in the first state on the emitted overall spectrum is as well. When a larger proportion of the radiation of the organic light-emitting diode 2 is emitted towards the main radiation surface 31, a high light emission is achieved, wherein the impact of the light selectively reflected in the first state of the liquid crystal element 1 is only comparatively low on the overall spectrum, however.

Figure 2:
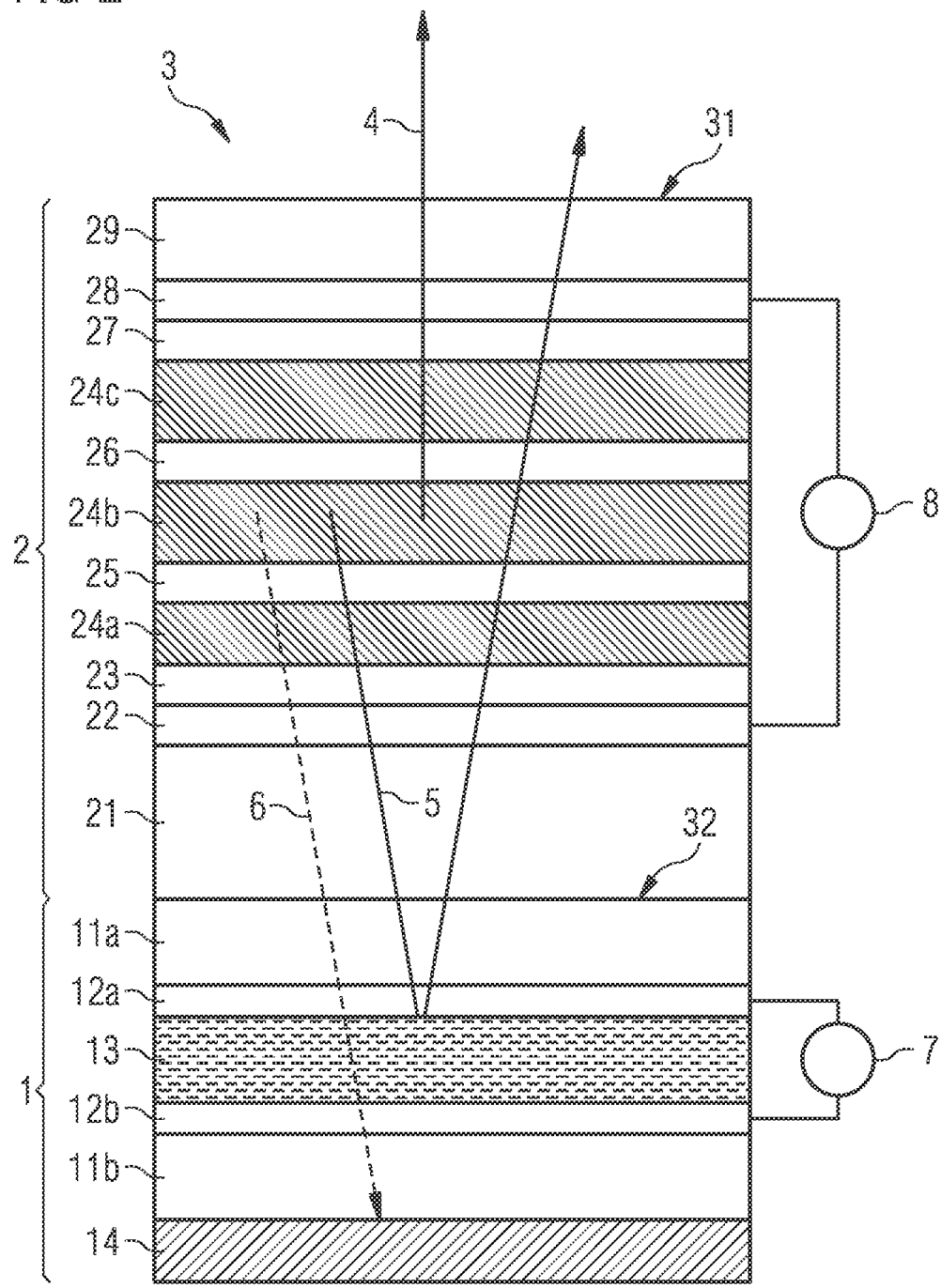

It can therefore be advantageous to orient the organic light-emitting diode 2 towards the liquid crystal element 1 in such a way that the stronger emission of the organic light-emitting diode 2 ensues towards the rear side 32. Such an exemplary embodiment is shown in FIG. 2. In this exemplary embodiment the organic light-emitting diode 2 is structured as in the first exemplary embodiment, but rotated by 180° vis-à-vis the liquid crystal element 1 compared with the first exemplary embodiment. In the second exemplary embodiment the substrate 21 of the organic light-emitting diode 2 thus faces the liquid crystal element 1 and an opposite surface of the transparent encapsulation 29 forms the main emission surface 31. In this exemplary embodiment, for example, it may be provided that a maximum of 40%, advantageously a maximum of 35% or preferably a maximum of 30% of the emitted radiation is emitted towards the main emission surface 31 and correspondingly a minimum of 60%, advantageously a minimum of 65% and preferably a minimum of 70% is emitted towards the rear side. The liquid crystal element 1 in the second exemplary embodiment can be structured identically to the first exemplary embodiment. Due to the stronger emission of the organic light-emitting diode 2 towards the rear side 32, the impact of the state of the liquid crystal element 1 on the emitted overall spectrum is substantially greater in the second exemplary embodiment than in the first exemplary embodiment. Further advantages and advantageous configurations of the second exemplary embodiment correspond to the first exemplary embodiment and are not be re-explained.

Figure 4:
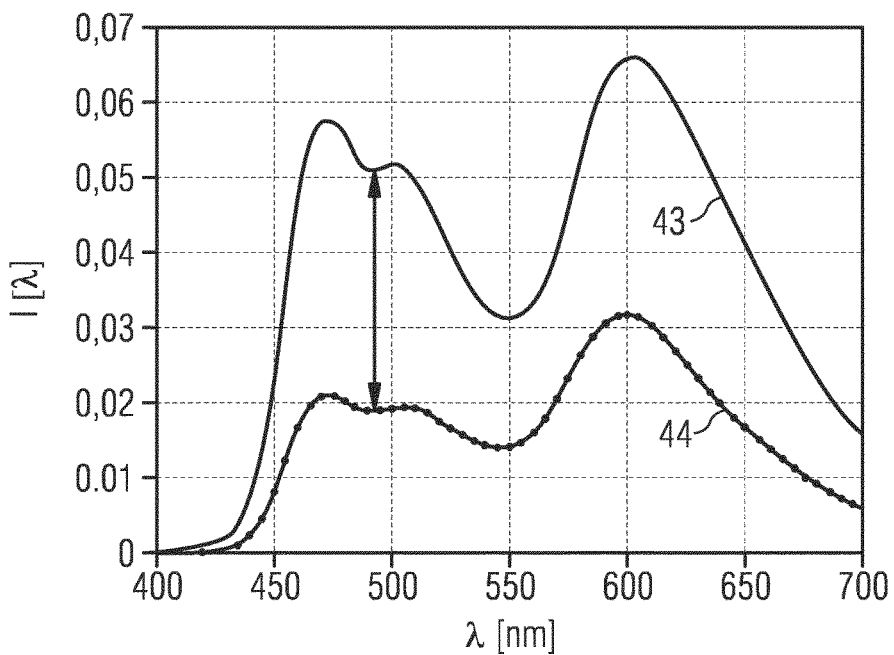

FIG. 4 shows exemplary emission spectra I(λ), which are emitted through the main emission surface 31 by an optoelectronic component according to the embodiment in FIG. 2. The graph 43 shows the emission of the optoelectronic component in the first state of the liquid crystal element and the graph 44 in the second state of the liquid crystal element. The overall emission in the partially reflecting first state of the liquid crystal element is greater than in the transparent second state, as part of the radiation emitted to the rear in the first state is reflected towards the main emission surface. Conversely, in the transparent second state of the liquid crystal element, only the lower radiation percentage emitted to the front through the main emission surface and the remaining radiation is absorbed in the light-absorbing layer.

FIG. 5 clarifies the impact of the liquid crystal element on the colour location of the radiation emitted by the optoelectronic components according to the first exemplary embodiment and the second exemplary embodiment. The colour coordinates Cx, Cy for the unchanged spectrum of the organic light-emitting diode in both embodiments (point 45) are shown as well as the colour coordinates in the first state of the liquid crystal element in the first embodiment (point 46) and in the first state of the liquid crystal element in the second embodiment (point 47). The graph in the diagram is the Planckian radiation characteristic of the black body and the lines drawn identify colour coordinates of the same colour temperature, the values of which are indicated in Kelvin.

It can be discerned that the colour location 46 in the first state of the liquid crystal element has been minimally shifted in the first exemplary embodiment compared with the colour location 45 of the unchanged spectrum and, in fact, towards a lower colour temperature. In the second exemplary embodiment, in which the radiation side of the organic light-emitting diode with the greatest luminous intensity faces the liquid crystal element, the colour location 47 in the first state of the liquid crystal element has been perceptibly shifted compared with the colour location 45 of the unchanged emission spectrum of the organic light-emitting diode and, in fact, at a lower colour temperature.

The invention is not limited by the description on the basis of the exemplary embodiments. Instead, the invention comprises every new feature as well as every combination of features, which in particular includes every combination of features in the claims, even if such feature or such combination is itself not explicitly specified in the claims or exemplary embodiments.

The invention claimed is:

1. An optoelectronic component comprising:
  an organic light-emitting diode configured to emit radiation through a main emission surface; and
  a liquid crystal element configured to adjust a colour location of the radiation emitted by the organic light-emitting diode through the main emission surface,
  wherein the liquid crystal element is switchable into a first state and into a second state,
  wherein the liquid crystal element in the first state is suitable for selectively reflecting light of a first wavelength range and in the second state is transparent,
  wherein the light emitted through the main emission surface has a lower colour temperature in the first state than in the second state,
  wherein the liquid crystal element is arranged on a rear side of the organic light-emitting diode facing the main emission surface so that light of the first wavelength range that is emitted towards the rear side is at least partially reflected in a direction of the main emission surface in the first state of the liquid crystal element, and
  wherein the organic light-emitting diode is configured to emit white light.

2. The optoelectronic component according to claim 1, wherein the organic light-emitting diode has at least two light-emitting organic layers configured to emit in different wavelength ranges.

3. The optoelectronic component according to claim 2, wherein the light-emitting organic layers are arranged on top of each other.

4. The optoelectronic component according to claim 1, further comprising a light-absorbing layer arranged on a surface of the liquid crystal element facing away from the organic light-emitting diode.

5. The optoelectronic component according to claim 1, wherein the light of the first wavelength range comprises yellow light.

6. The optoelectronic component according to claim 1, wherein the organic light-emitting diode has an asymmetrical light emission, and wherein more radiation is emitted towards the rear side than towards the main emission surface.

7. The optoelectronic component according to claim 6, wherein the organic light-emitting diode comprises a transparent substrate, and wherein the transparent substrate is arranged on the rear side.

8. The optoelectronic component according to claim 1, wherein the organic light-emitting diode has an asymmetrical light emission, wherein more radiation is emitted towards the main emission surface than towards the rear side.

9. The optoelectronic component according to claim 1, wherein the liquid crystal element is a cholesteric liquid crystal element, which contains a liquid crystal, which has a planar texture in the first state and a focal-conic texture in the second state.

10. A method for operating the optoelectronic component according to claim 1, wherein the method comprises:
  switching the liquid crystal element from the first state into the second state or from the second state into the first state by a voltage source so that a colour temperature of the radiation emitted by the optoelectronic component is changed.

11. The method according to claim 10, further comprising operating the voltage source in pulsed mode in order to repeatedly switch the liquid crystal element from the first state into the second state or from the second state into the first state in a predetermined time sequence.

12. An optoelectronic component comprising:
- an organic light-emitting diode configured to emit white light through a main emission surface;
- a liquid crystal element configured to adjust a colour location of the white light emitted by the organic light-emitting diode through the main emission surface; and
- a light-absorbing layer arranged on a surface of the liquid crystal element facing away from the organic light-emitting diode,
- wherein the liquid crystal element is switchable into a first state and into a second state,
- wherein the liquid crystal element in the first state is suitable for selectively reflecting light of a first wavelength range and in the second state is transparent,
- wherein the liquid crystal element is arranged on a rear side of the organic light-emitting diode facing the main emission surface,
- wherein a light of a first wavelength range that is emitted towards the rear side by the organic light-emitting diode is at least partially reflected in a direction of the main emission surface in the first state of the liquid crystal element, and
- wherein a light emitted through the main emission surface has a lower colour temperature in the first state than in the second state.

* * * * *